US010903276B2

(12) United States Patent
Chan et al.

(10) Patent No.: US 10,903,276 B2
(45) Date of Patent: Jan. 26, 2021

(54) METHODS OF FORMING METAL ON INHOMOGENEOUS SURFACES AND STRUCTURES INCORPORATING METAL ON INHOMOGENEOUS SURFACES

(71) Applicant: Micron Technology, Inc., Boise, ID (US)

(72) Inventors: Tsz Wah Chan, Boise, ID (US); Yongjun J. Hu, Boise, ID (US); Swapnil Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/685,276

(22) Filed: Nov. 15, 2019

(65) Prior Publication Data

US 2020/0091244 A1    Mar. 19, 2020

Related U.S. Application Data

(60) Continuation of application No. 15/439,727, filed on Feb. 22, 2017, now Pat. No. 10,510,805, which is a
(Continued)

(51) Int. Cl.
*H01L 27/24* (2006.01)
*H01L 45/00* (2006.01)
(Continued)

(52) U.S. Cl.
CPC ........ *H01L 27/2481* (2013.01); *H01L 23/528* (2013.01); *H01L 23/53257* (2013.01);
(Continued)

(58) Field of Classification Search
CPC .......... H01L 27/2481; H01L 23/53257; H01L 45/1253
See application file for complete search history.

(56) References Cited

U.S. PATENT DOCUMENTS

| 4,822,749 A | 4/1989 | Flanner et al. |
| 4,954,214 A * | 9/1990 | Ho .................... H01L 21/32051 257/E21.295 |

(Continued)

FOREIGN PATENT DOCUMENTS

| KR | 100442021 B1 | 12/2004 |
| TW | 201250992 A | 12/2012 |

OTHER PUBLICATIONS

Rossnagel et al. "Phase transformation of thin sputter-deposited tungsten films at room temperature" in Journal of Vacuum Science & Technology B vol. 20 p. 2047. Published by American Vacuum Society in 2002 (Year: 2002).*
(Continued)

*Primary Examiner* — Tuan A Hoang
(74) *Attorney, Agent, or Firm* — Holland & Hart LLP

(57) ABSTRACT

The disclosed technology relates to integrate circuits, including memory devices. A method of forming an integrated circuit comprises providing a surface comprising a first region and a second region, wherein the first region is formed of a different material than the second region. The method additionally comprises forming a seeding material in contact with and across the first and second regions. The method further comprises forming a metal comprising tungsten on the seeding material.

20 Claims, 8 Drawing Sheets

Related U.S. Application Data division of application No. 14/106,535, filed on Dec. 13, 2013, now abandoned.

(51) Int. Cl.
*H01L 23/528* (2006.01)
*H01L 23/532* (2006.01)

(52) U.S. Cl.
CPC .......... *H01L 27/2427* (2013.01); *H01L 45/06* (2013.01); *H01L 45/1233* (2013.01); *H01L 45/1253* (2013.01); *H01L 45/144* (2013.01); *H01L 45/16* (2013.01)

(56) References Cited

U.S. PATENT DOCUMENTS

| | | | |
|---|---|---|---|
| 5,397,735 A | | 3/1995 | Mercandalli et al. |
| 5,414,271 A | | 5/1995 | Ovshinsky et al. |
| 5,493,558 A | | 3/1996 | Kapoor |
| 5,650,648 A | | 7/1997 | Kapoor |
| 5,851,581 A | * | 12/1998 | Zenke ..................... C23C 16/14 438/656 |
| 6,077,729 A | | 6/2000 | Harshfield |
| 6,703,303 B2 | | 3/2004 | Chen et al. |
| 7,215,564 B2 | | 5/2007 | Happ et al. |
| 7,504,725 B2 | | 3/2009 | Kim et al. |
| 7,678,679 B2 | | 3/2010 | Manger et al. |
| 7,830,016 B2 | | 11/2010 | Meldrim et al. |
| 7,893,433 B2 | | 2/2011 | Todd et al. |
| 8,264,866 B2 | * | 9/2012 | Fukumizu ............. H01L 45/144 365/148 |
| 8,765,581 B2 | | 7/2014 | Lee et al. |
| 9,129,830 B2 | | 9/2015 | Baek et al. |
| 2008/0050892 A1 | | 2/2008 | Shin et al. |
| 2008/0073645 A1 | | 3/2008 | Todd et al. |
| 2010/0108976 A1 | * | 5/2010 | Jayasekara ............. B82Y 10/00 257/4 |
| 2011/0069525 A1 | | 3/2011 | Fukumitzu et al. |
| 2011/0215326 A1 | | 9/2011 | Godo et al. |
| 2011/0298057 A1 | | 12/2011 | Kato |
| 2012/0225534 A1 | * | 9/2012 | Lee ........................ H01L 45/06 438/382 |
| 2012/0287706 A1 | | 11/2012 | Lung |

OTHER PUBLICATIONS

ISA/EPO, International Search Report and Written Opinion of the International Searching Authority, Int'l Appl. No. PCT/US2014/068916, dated Mar. 3, 2015, Korean Intellectual Property Office, Seo-gu, Daejeon Metropolitan City, Republic of Korea, 10 pgs.

Learn et al., "Resistivity, grain size, and impurity effects in chemically vapor deposited tungsten films" Journal of Applied Physics, Sep. 1, 1985, 7 pgs., vol. 58, American Institute of Physics.

Office Action dated Sep. 7, 2015 in corresponding R.O.C. (Taiwan) Patent Application No. 103143536.

Office Action dated Jan. 26, 2016 in corresponding R.O.C. (Taiwan) Patent Application No. 103143536 with English Translation.

Petroff et al., "Microstructure, growth, resistivity, and stresses in thin tungsten films deposited by rf sputtering," Journal of Applied Physics, Jun. 1, 1973, vol. 44, No. 6, American Institute of Physics, 1973.

Rossnagel et al., "Phase transformation of thin sputter-deposited tungsten films at room temperature," Journal of Vacuum Science and Technology, Jul. 22, 2002, 6 pgs., B, vol. 20, No. 5, Sep./Oct. 2002, American Vacuum Society, 2002.

Weerasekera et al., "Structure and stability of sputter deposited beta-tungsten thin films," Applied Physics Letters, Jun. 13, 1994, 4 pgs., vol. 64, No. 24, American Institute of Physics, 1994.

CNIPA, "Office Action," issued in connection with Chinese Patent Application No. 201480073462.4, dated Apr. 9, 2019 (7 pages).

* cited by examiner

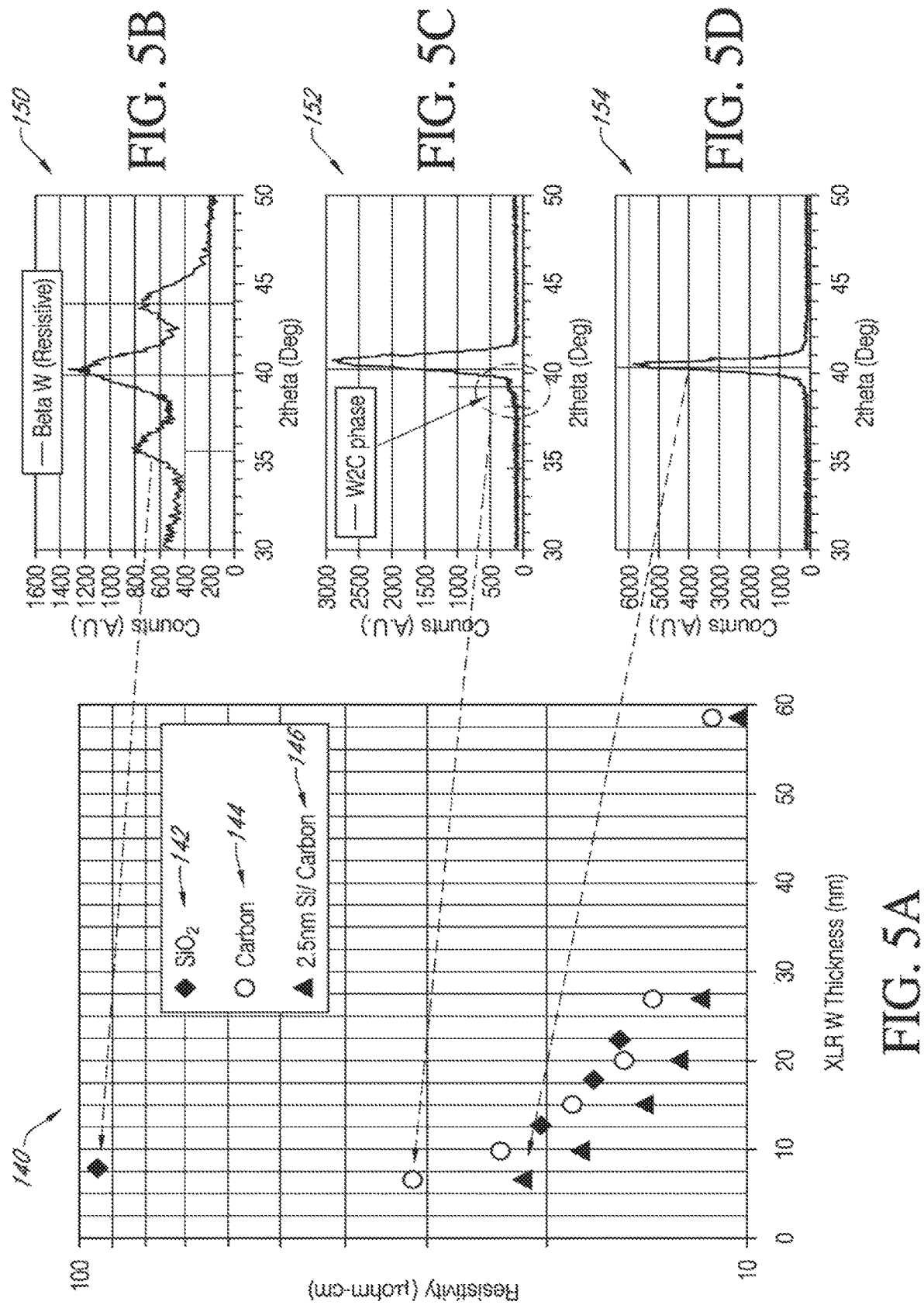

METHODS OF FORMING METAL ON INHOMOGENEOUS SURFACES AND STRUCTURES INCORPORATING METAL ON INHOMOGENEOUS SURFACES

CROSS REFERENCE

The present application for patent is a continuation of U.S. patent application Ser. No. 15/439,727 by Chan et al., entitled "Methods of Forming Metal on Inhomogeneous Surfaces and Structures Incorporating Metal on Inhomogeneous Surfaces," filed Feb. 22, 2017, which is a divisional of U.S. patent application Ser. No. 14/106,535 by Chan et al., entitled "Methods of Forming Metal on Inhomogeneous Surfaces and Structures Incorporating Metal on Inhomogeneous Surfaces," filed Dec. 13, 2013, assigned to the assignee hereof, and each of which is expressly incorporated by reference in its entirety herein.

BACKGROUND

Field

Disclosed technology relates generally to integrated circuits, and more particularly, to methods of forming metal on inhomogeneous surfaces, such as across memory cells.

Description of the Related Art

Integrated circuits comprising deposited metal, such as tungsten metallization, may be found in a wide range of electronic devices, including computers, digital cameras, cellular telephones, personal digital assistants, etc. The metallization can form portions of the overall metallization scheme that are used, for example, to interconnect discrete devices, such as transistors or memory cells, with electrical input/output pins. As metal interconnects are scaled in dimensions, the resistance of the metal interconnects increases. Thus, in order to reduce the increase in the resistance of the metal interconnects, there is a need for metal structures whose resistance can be lowered by reducing the resistivity of the metal structures.

BRIEF DESCRIPTION OF THE DRAWINGS

FIG. 5A is a graph illustrating experimental resistivity of a conductive material as a function of a thickness of the conductive material according to some embodiments.

FIG. 5B is a graph illustrating an x-ray diffraction spectrum of a conductive metal material according to some embodiments.

FIG. 5C is a graph illustrating an x-ray diffraction spectrum of a conductive metal material according to some other embodiments.

FIG. 5D is a graph illustrating an x-ray diffraction spectrum of a conductive metal material according to some other embodiments.

Figure 1A:
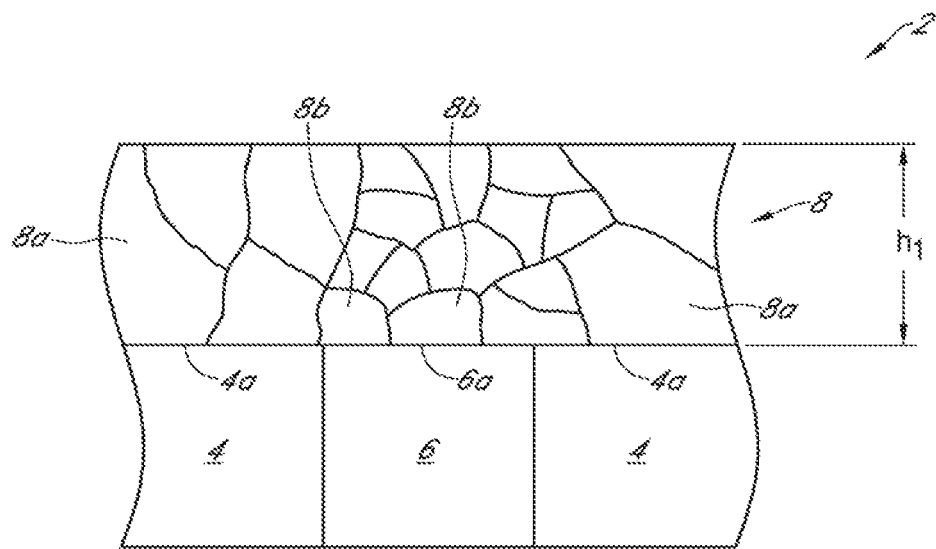
FIG. 1A is a schematic cross-sectional depiction of a metallization structure formed on a heterogeneous surface.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Metal interconnects of an integrated circuit (IC) provide electrical connections between discrete devices, such as transistors, resistors, or memory cells and external electrical inputs and outputs, such as I/O pins. As IC's continue to miniaturize in size, interconnects can be a bottleneck for many performance metrics. For example, increasing resistance and/or increasing capacitance of the metal interconnects can limit access speed and increase power consumption of electronic devices, e.g., wireless devices, personal computers, etc.

As metal interconnects are scaled in dimensions, the resistance of the metal interconnects increases. This is because the resistance of a metal structure (e.g., metal lines and vias) is generally proportional to the cross-sectional area (e.g., a product of a width and a height of a rectangular metal structure) of the metal structure, and shrinking a lateral dimension such as the width of the metal structure can lead to an undesirable increase in electrical resistance of the metal structure. For a given length of the metal structure, such an increase in the resistance of the metal structure can be compensated, under some circumstances, by proportionally increasing the height of the metal structure, thereby keeping the cross-sectional area relatively constant. However, such compensation can have negative consequences. For example, an increased height results in an increase in the area of the sides of the metal structures that extend in the lengthwise direction, which can lead to an increased capacitance of the metal lines. In addition, increased height of the metal structures can lead to increased processing difficulty, such as difficulty of etching of the metal lines or difficulty of filling gaps formed between the metal lines with dielectric materials where the lines are formed by etching a metal layer. Thus, there is a need for metal structures whose resistance can be lowered independent of dimensional compensation by minimizing the resistivity of the metal structures. In some embodiments described herein, resistivity is minimized through controlling the microstructure and phases of metal material that form the metal structures.

Metal structures comprising tungsten are used to form various components of interconnects for a variety of applications, including memory devices. The metal structures comprising tungsten include electrodes, vias, metal lines, contacts, and plugs, among others. The wide usage of tungsten in various metal structures may be due at least in part to a relative wide range of options available for processing tungsten, including deposition processes and etch processes. Tungsten can be deposited, for example, using atomic layer deposition (ALD), chemical vapor deposition (CVD), evaporation, and physical vapor deposition (PVD), among others. In addition, many known etch chemistries exist for tungsten, including chemistries that employ fluorine, chlorine, and sulfur, among others.

The electrical resistivity of a thin film comprising tungsten can be affected by characteristics of the surface onto which the thin film is deposited. Without being limited by theory, it is believed that a reason for such dependence can be, for example, an interfacial energy between the thin film material and the material that provides the surface. In this connection, under certain circumstances, it can be advantageous to form the thin films on a homogenous surface having a single material instead of a heterogeneous surface having more than one material. Having the homogeneous surface can lead to advantages such as a homogeneous size distribution and/or a tighter size distribution of grains in the thin film. In this connection, various embodiments disclosed herein form metal structures from metal thin films, e.g., comprising tungsten, that are deposited on a homogeneous surface.

In addition, a homogenous surface can also be advantageous in controlling the phases of the thin film material. For example, tungsten has been observed to have at least two solid crystalline phases: a low resistivity alpha-phase having a body-centered cubic (bcc) structure and a high resistivity beta-phase having a cubic (A15) structure. The former is understood to be an equilibrium phase. In a given thin film comprising tungsten, either or both of the alpha and beta-phases can be present. Under certain circumstances, the difference in resistivity between the alpha and beta-phases of tungsten can exceed 10×. Therefore, without being limited by theory, when a lower resistivity of the metal structures is desired, it may advantageous to control the microstructure of the metal structures comprising tungsten such that a fraction of the lower resistivity alpha tungsten in the metal structure is maximized. In this connection, various embodiments disclosed herein may form metal structures predominantly comprising alpha-phase tungsten and essentially free of beta-phase tungsten.

FIG. 1A is a schematic cross-sectional depiction of a metallization structure 2 formed on a heterogeneous surface 4a, 6a. The metallization structure may be an interconnect structure. A method of forming the interconnect structure 2 includes providing a substrate which includes a first material 4 and a second material 6 different from the first material adjacent the first material 4. The method additionally includes providing an exposed surface comprising a first surface region 4a of the first material and a second surface region 6a of the second material. The method further includes depositing via a physical vapor deposition process a blanket thin film metal 8 comprising tungsten on the first and second surface regions 4a and 6a. The thin film metal 8 can be subsequently patterned to form various interconnect structures, e.g., metal lines.

The first material 4 can serve as an electrical conductor, such as, for example, a via, a plug, a contact, or other similar structures. The first material 4 can include a metallic material, such as carbon, tungsten, aluminum, copper, titanium nitride, tantalum nitride, and doped crystalline silicon, among other metallic materials.

The second material 6 can serve as an electrical insulator, such as, for example, an intermetal dielectric, interlayer dielectric, and an isolation dielectric, among others. The second material can include a dielectric material, such as silicon oxide, silicon nitride, and silicon oxynitride, among other oxides or dielectrics.

The first material 4 is formed first by depositing a thin film of metal and subsequently patterning the thin film to form the first metal materials 4 separated by gaps, followed by depositing a dielectric material within the gaps to form the second materials 6. This type of process is sometimes referred to as a "subtractive metal" process. In other embodiments, the second material 6 is formed first by depositing a thin film of dielectric and subsequently patterning the dielectric to form second materials 6 separated by gaps, followed by formation of the first material 4 by plating/depositing a metal material within the gaps to form the first materials 4. This type of process is sometimes referred to as a "damascene" process.

After the first and second materials 4 and 6 are formed by one of subtractive or damascene processes, a substantially planar surface including the first and second surface regions 4a and 6a are formed by planarization, using, for example, a chemical mechanical polishing (CMP) process. In a "subtractive metal" process, the CMP process removes excess dielectric materials deposited on patterned first materials 4 to form the substantially planar surface, whereas in a "damascene" process, the CMP process removes excess metal material deposited on patterned second materials 6 to form the substantially planar surface. As used herein, a "substantially" planar surface is a generally planar surface that can include step heights between adjacent first and second materials 4 and 6 that can result from routine processing variations. Such variations can arise, for example, due to a difference between CMP removal rates between the first and second materials 4 and 6. This is sometimes referred to as "dishing." While such step heights can depend on the particular condition of the CMP process, in the embodiments described herein, "a substantially" planar surface will be understood to have local step height variations resulting from dishing that generally do not exceed thicknesses of the materials being planarized (e.g., first and second materials 4 and 6 in FIG. 1A), For example, a planar surface can have a local step height variations that do not exceed, for example, 0 nm to 20 nm, for example about 5 nm.

The thin film metal 8, which can comprise tungsten, can be deposited by physical vapor deposition (PVD). For example, the thin film metal 8 can be deposited in a DC magnetron sputtering system. In other embodiments, the thin film metal 8 is deposited by chemical vapor deposition or atomic layer deposition.

In some embodiments, the thin film metal 8 is deposited at a low deposition rate between 0.01 Å/s and about 1 Å/s, for instance 0.15 Å/s. In other embodiments, the metal material 8 is deposited at a high deposition rate between about 1 Å/s and about 100 Å/s, for instance about 11 Å/s. In some embodiments, active chucking is applied to the wafer during deposition with a backside argon flow to keep the wafer cool between about 10° C. and about 100° C., for instance about 17° C.

The microstructure of the thin film metal 8 comprising tungsten can depend on several factors, including an interfacial energy between the thin film material 8 and the surface on which the grains grow. For the heterogeneous surface illustrated in FIG. 1A including first and second surface regions 4a and 6a, a first interfacial energy between the thin film metal 8 and the first surface region 4a and a second interfacial energy between thin film material 8 and the second surface region 6a can be different. The resulting microstructure can have grains that are not monodisperse in size distribution; i.e., the grains can have a size distribution having, for example, multiple peaks. For example, by way of an illustration only in FIG. 1A, a first average size of grains 8a formed over the first surface region 4a can be different from a second average size of grains 8b formed over the second surface region 6a. In the structure illustrated in FIG. 1A, the grains 8a formed over the first surface region 4a are depicted as being larger on average than the grains 8b formed over the second surface region 6a in FIG. 1A for illustration purposes only. In other cases, the grains 8a formed over the first surface region 4a can be smaller on average than the grains 8b formed over the second surface region 6a. In yet other cases, the grains 8a formed over the first surface region 4a can be similar on average compared to the grains 8b formed over the second surface region 6a.

Where the thin film metal 8 is formed of tungsten, the deposited tungsten can include both of the alpha and beta-phases of tungsten. When both phases are present, the relative amounts of alpha and beta-phases of tungsten can depend on several factors. Without being bound to any theory, the availability of oxygen atoms in the underlying materials (i.e., first and second materials 4 and 6 in FIG. 1A) can be a factor in the formation of beta-phase tungsten. When a sufficient amount of oxygen atoms, which can be bound or free, is present, a substantial amount of beta-phase tungsten can be present in the as-deposited thin film metal 8. A substantial amount of beta-phase tungsten can be present, for example, when at least one of the first and second materials 4 and 6 includes oxygen atoms. As illustrated in FIG. 1A, for example, when the second material 6 is an interlayer dielectric (ILD) comprising an oxide (e.g. $SiO_2$), at least a fraction of grains 8b formed over the second surface region 6a can comprise beta-phase tungsten. In contrast, when the first material 4 is a metallic material that is substantially free of oxygen (e.g., carbon), at least a fraction of grains 8a formed over the first surface region 4a can comprise alpha-phase tungsten. While FIG. 1A illustrates beta-phase tungsten grains 8b formed above the second surface region 6a and alpha-phase tungsten grains 8a formed above the first surface region 4a, the depiction is for illustrative purposes only, and the actual location and distribution of alpha and beta-phase tungsten grains 8a and 8b can be substantially intermixed above the first and second surface regions 4a and 6a. In addition, in other embodiments, the first material 4 can also comprise oxygen atoms that can be a factor in formation of beta-phase tungsten.

As used herein, a thin film material having a "substantial" amount of a phase of tungsten (e.g., alpha-phase) refers to a thin film of the metal material 8 having between about 50% and about 100%, or between about 75% and about 100%, for instance about 90% in volume fraction of the phase. The volume fraction of a phase of tungsten can be determined, for example, by curve-fitting of the X-ray diffraction pattern of the thin film using methods known in the art. Similarly, a thin film material being "substantially free" of a phase of tungsten (e.g., beta-phase) refers to a thin film of the metal material 8 having less than about 50%, or less than about 10% in volume fraction of the phase.

As used herein, a thin film material that consists "essentially of a phase of tungsten (e.g., alpha-phase) refers to a thin film of the metal material 8 that do not show an appreciably detectable amount of other phases, as detectable by curve-fitting of the X-ray diffraction pattern of the thin film.

Still referring to FIG. 1A, the thickness $h_1$ of the thin film metal 8 can be one factor that influences whether or not a substantial amount of a particular phase of tungsten (e.g., beta-phase tungsten) is present. For example, without being bound by theory, on a heterogeneous surface such as in FIG. 1A, the thin film metal 8 can initially grow as a film comprising predominantly beta-phase tungsten and substantially free of alpha-phase tungsten up to a certain thickness. Beyond a certain thickness, an additional thickness of the thin film metal 8 can transition into a thin film portion comprising both alpha and beta-phases, or as a thin film portion being substantially free of beta-phase tungsten. Without being bound to any theory, such transition can be caused by, for example, a growth surface having access to less oxygen from the underlying materials. In some cases, when grown directly on first and second surface regions 4a and 6a, at least one of which comprises oxygen atoms that are available for initiation of beta-phase tungsten, the thin film metal 8 having a thickness less than about 15 nm can be substantially free of alpha-phase tungsten. The foregoing poses a challenge for fabricating many ICs having low-resistance tungsten-based interconnect structures (e.g., metal lines), because many interconnect structures comprise oxygen in the underlying structures (e.g., $SiO_2$ ILD), and many such structures are formed from a thin film metal structure 8 having a thickness less than about 15 nm. The materials and processes employed to form the interconnect structures favor formation of interconnect structures comprising either predominantly beta-phase tungsten and substantially free of alpha-phase tungsten, or interconnect structures comprising both alpha and beta-phases, but do not favor formation of interconnect structures comprising predominantly alpha-phase tungsten and substantially free of beta-phase tungsten.

Figure 1B:
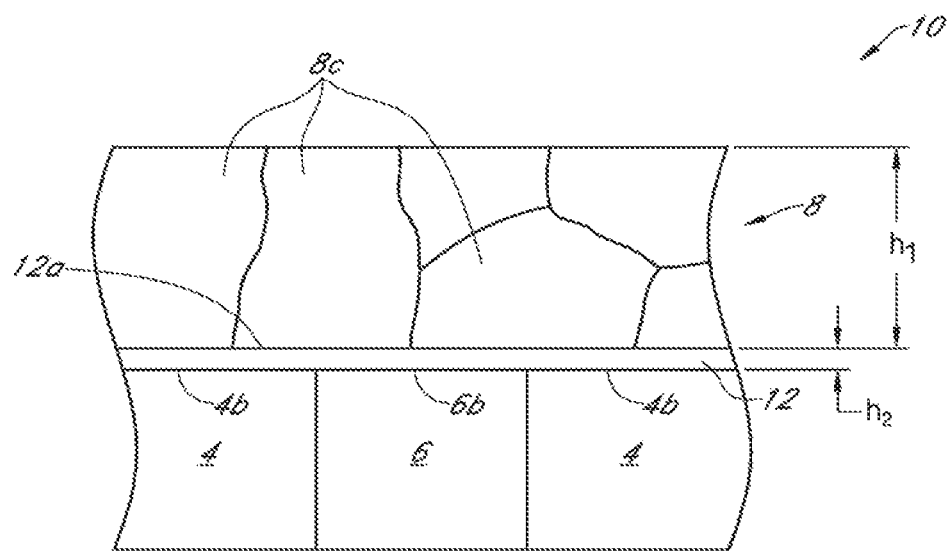
FIG. 1B is a schematic cross-sectional depiction of a metallization structure according to some other embodiments.

Referring now to FIG. 1B, a schematic partial cross-sectional view depicting a metallization structure 10 according to some other embodiments is illustrated. In some embodiments, the metallization structure 10 may be an interconnect structure. Similar to FIG. 1A, in some embodiments, a method for forming the interconnect structure 10 includes providing a substrate which includes a first material 4 and a second material 6 different from and adjacent to the first material 4, and includes providing an exposed surface comprising a first surface region 4b of the first material 4 and a second surface region 6b of the second material 6. In contrast to FIG. 1A, instead of depositing a thin film metal 8 on the first and second surface regions 4b and 6b, however, the method of FIG. 1B includes forming, e.g., depositing, a seeding material 12 on the first and second surface regions 4b and 6b, to provide a homogeneous surface 12a. The method further includes forming, e.g., depositing, for example using a PVD process, a thin film metal 8, e.g., comprising tungsten, on the homogenous surface 12a. The thin film metal 8 can be subsequently patterned to form various structures, such as interconnect structures, e.g., metal lines.

Several factors can affect the resistivity of the blanket thin film metal 8. One such factor can be the microstructure of the thin film metal 8. For example, the resistivity of the metal material can depend on an average grain size of thin film metal 8 and the distribution of grain sizes (e.g., standard deviation) in that thin film. Without being bound to any theory, it is believed that such a dependence can originate from, among other origins, a correlation between a mean free path of electrons and the average grain size, at least in part due to a higher probability of electronic collisions occurring at grain boundaries. In this connection, in some embodiments, it can be advantageous to have a relatively large average grain size and a relatively small standard deviation of the grain size. The illustrated embodiment of FIG. 1B can achieve this advantageous result by interposing a suitable seeding material 12 between the first and second surface regions 4b and 6b and the thin film metal 8. As discussed above in connection with FIG. 1A, forming the blanket thin film metal 8 on a heterogeneous surface (e.g., first and second surface regions 4a and 6a) can introduce a grain size distribution that can be non-monodisperse. In the illustrated embodiment of FIG. 1B, the blanket seeding material 12 provides a homogeneous surface 11a that can provide a more monodisperse grain size distribution.

Another factor that can affect the resistivity of the thin film metal 8 is the presence of certain phases and the resistivity of the phases present. In this connection, it can be advantageous to have a higher fraction of alpha-phase tungsten compared to beta-phase tungsten. As discussed in connection with FIG. 1A, when the heterogeneous surface includes a surface comprising a substantial amount of oxygen (e.g., $SiO_2$), a substantial amount of beta-phase tungsten may from as a result, especially when the thickness $h_1$ of the thin film metal 8 has a thickness less than about 15 nm. In the illustrated embodiment of FIG. 1B, the seeding material 12 can be chosen to be a material substantially free of oxygen to promote formation of the thin film metal 8 that is substantially free of beta-phase tungsten. In some embodiments, the thin film metal 8 can consist essentially of alpha-phase tungsten, such that an X-ray diffraction pattern of the thin film metal 8 does not show peaks attributable to beta-phase tungsten.

Even when the seeding material 12 provides a homogenous surface 12a, the presence of crystalline facets in the grains at the exposed seeding material 12 can affect the microstructure of the thin film metal 8. In this aspect, it may be advantageous to minimize the effect of the crystalline facets. In this connection, in some embodiments, the seeding material 12 comprises an amorphous material. A suitable amorphous material can include amorphous semiconductors including, for example, amorphous silicon and amorphous germanium. In other embodiments, a suitable amorphous material can include amorphous metal nitrides including, for example, silicon nitride. However, inventive aspects are not limited to amorphous seeding materials and other embodiments can include crystalline seeding materials.

In some embodiments, the seeding material 12 can be deposited using any suitable method, for example by a PVD process or a CVD process. In some embodiments, the seeding material 12 and the thin film metal 8 can be deposited in-situ, in the same chamber, without exposing the surface of the seeding material to air outside the chamber. For example, the thin film metal 8 can be deposited in-situ using a multi-target PVD system. Such an in-situ process can be advantageous in further reducing oxygen atoms from the homogeneous surface 12a.

The thickness h? of seeding material 12 can be any suitable thickness to provide sufficient and continuous coverage for a homogenous surface 12a. In this respect, in some embodiments, a suitable thickness can be between about 1 nm and about 15 nm. In other embodiments, a suitable thickness can be between about 2 nm and about 15 nm, about 2.5 nm and about 15 nm, about 1 nm and about 4 nm, for instance about 2.5 nm.

In the following, embodiments of interconnect structures and methods of forming the same in the context of memory arrays are discussed in further detail. In general, memory performance and memory, bit density can depend on the process architecture and materials employed to form the memory array. For example, in the context of cross-point memory arrays, the process architecture and materials employed to define conductive access lines (e.g., column lines and row lines) for accessing the memory cells can have a direct impact on the resistance and the capacitance of the conductive access lines, thereby affecting memory performance, such as, for example, access times. On the one hand, narrower conductive access lines can allow for higher density of conductive access lines per unit area, which in turn allows for higher density of memory cells per unit area. On the other hand, the resistance of the conductive access lines can increase substantially when the width and/or the height of the conductive access lines are reduced. Thus, as discussed herein, there is a need for a method of forming conductive access lines with reduced resistivity.

Referring to FIGS. 2A-2D, a method of forming conductive lines comprising a metal, e.g., substantially single alpha-phase tungsten, is illustrated. In some embodiments, a metal can be "substantially" single alpha-phase tungsten if over about 90% of the volume fraction of the metal comprises alpha-phase tungsten. As used herein, conductive lines are elongated conductive structures that many be elongated along a single axis, may be curved, or may include different portions that are each elongated along different axes. The method of forming the conductive lines includes providing an intermediate array structure 100b (FIG. 2B) comprising a memory cell line stack adjacent an insulating material 48. The memory cell line stack includes a lower electrode line 40, a lower chalcogenide element line 38b, a middle electrode line 36b, an upper chalcogenide element line 34b, and an upper electrode line 32b. The method additionally includes depositing a second seeding material 42b (FIG. 2C) on a substantially planarized surface comprising an electrode surface 62 and an isolation surface 60. The method additionally includes depositing an upper conductive material 20b comprising tungsten on the second seeding material 42b. The method further includes patterning the second seeding material 42b and the upper conductive material 20b to form an upper conductive line 20 comprising substantially single alpha-phase tungsten. In some embodiments, the electrode surface 62, the isolation surface 60, and the seeding layer 42b correspond to the surface 4a, surface 6a, and the seeding layer 12, respectively, of FIG. 1B.

While in the following, embodiments are described in the context of forming conductive lines comprising a metal, the present invention is not so limited. For example, the methods described herein are generally applicable to forming conductive materials and conductive material regions over an inhomogeneous surface. Such conductive materials can have any shape. In addition, the embodiments can be applied to whether or not the inhomogeneous surface is substantially planar, and can be applied to both horizontal and vertical inhomogeneous surfaces.

Figure 2A:
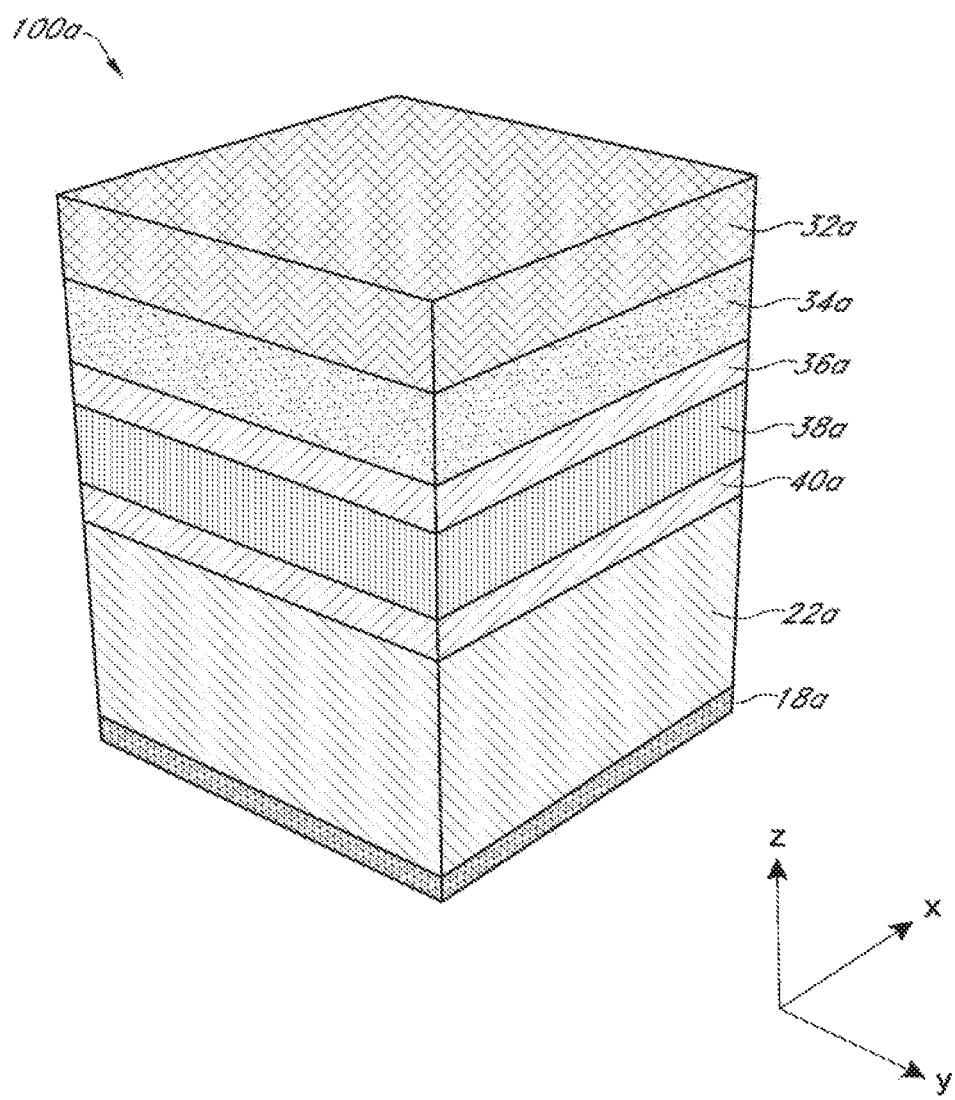
FIGS. 2A-2D are schematic cross-sectional depictions of memory arrays at various stages of fabrication according to some embodiments.

Referring to intermediate array structure 100a of FIG. 2A, the method of forming conductive lines comprises providing a material stack including a first seeding material 18a over a substrate (not shown), a lower conductive material 22a (e.g., comprising tungsten) over the first blanket seeding material 18a, a lower electrode material 40a on the lower conductive material 22a (e.g., comprising tungsten), a lower chalcogenide material 38a on the lower electrode material 40a, a middle electrode material 36a on the lower chalcogenide material 38a, an upper chalcogenide material 34a on the middle electrode material 36a, and an upper electrode material 32a on the upper chalcogenide material 34a.

In some embodiments, the first blanket seeding material 18a is deposited on a substrate (not shown) having various structures including transistors that form the driving and sensing circuitry for the memory array. In this connection, the first blanket seeding material 18a may be deposited on a substrate surface including intermetal dielectric surfaces as well as conductive surfaces. The intermetal dielectric surfaces can include, for example, silicon oxide surfaces. The conductive surfaces can include, for example, surfaces of vias that electrically connect the underlying transistors and can include, for example, tungsten vias, polysilicon plugs, and copper vias, among other types of vertical conductive structures.

The first seeding material 18a covers both the intermetal dielectric surfaces as well as conductive surfaces of the substrate surface (not shown). As discussed in connection with FIG. 1B, the first seeding material 18a serves to provide a homogenous surface for the subsequent deposition of the lower conductive material 22a. The homogenous surface can, under certain circumstances, give rise to the lower conductive material 22a having grains characterized by a more uniform size distribution and/or a more uniform phase. In addition, the homogenous surface can, under certain circumstances, give rise to the lower conductive material 22a having a higher average grain size.

In some embodiments, similar to FIG. 1B, the first seeding material 18a comprises an amorphous material. The first seeding material 18a can include, for example, amorphous silicon or germanium, having a thickness preferably between 0.5 nm and about 4.5 nm, more preferably between about 1.5 nm and about 3.5 nm, for instance about 2.5 nm. In some embodiments, the amorphous material can be deposited using a suitable technique to achieve the amorphous microstructure, such as PVD. For example, in order to prevent substantial nucleation and/or growth of first seeding material 18a, in some embodiments, the deposition can be carried out at a substrate temperature preferably between about 10° C. and about 100° C., and more preferably between 10° C. and about 30° C.

In some embodiments, similar to FIG. 1B, the lower conductive material 22a comprising tungsten can have a thickness preferably between about 5 nm and about 25 nm, and more preferably between about 10 nm and about 20 nm, for instance about 15 nm.

In addition to higher average grain size and/or more uniform size distribution, depositing the lower metal material 22a comprising tungsten on the first seeding material 18a can also suppress certain undesirable phases of the lower metal material 22a, such as beta-phase tungsten, as discussed herein.

As discussed above, in some embodiments, when the intermetal dielectric surface of the substrate surface includes an oxide (e.g., silicon oxide), deposition of the lower conductive material 22a directly on the intermetal dielectric surface can result in the lower conductive material 22a having a substantial fraction of beta-phase tungsten, in embodiments where tungsten is deposited on the lower conductive material 22. As discussed above, formation of beta-phase tungsten may be facilitated by the presence of oxygen in the oxide of the intermetal dielectric. In contrast, when the lower conductive material 22a is deposited on the intervening first seeding material 18a as illustrated in FIG. 2A, the resulting lower conductive material 22a may substantially only include a single phase alpha-phase tungsten, and can be substantially free of beta-phase tungsten. In some embodiments, the lower conductive material 22a can consist essentially of alpha-phase tungsten, as illustrated by a lack of peaks attributable to other phases of tungsten in an x-ray diffraction spectrum of the lower conductive material 22a.

While in the foregoing, embodiments having the lower conductive material 22a comprising tungsten were described, it is to be understood that the lower conductive material 22a can comprise any conductive and/or semiconductive material suitable for forming lower conductive lines 22 to early electrical current for accessing the memory cells within the memoty array. Examples of conductive/semiconductive materials suitable for forming lower conductive lines 22 include n-doped poly silicon, p-doped poly silicon, metals including Al, Cu, and W, conductive metal nitrides including TiN, TaN, and TaCN, among others.

Still referring to FIG. 2A, the lower, middle, and upper electrode materials 40a, 36a, and 32a, respectively, can include one or more conductive and semiconductive materials suitable for forming electrodes including, for example, n-doped poly silicon and p-doped poly silicon; metals including C, Al, Cu, Ni, Cr, Co, Ru, Rh, Pd, Ag, Pt. Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

In some embodiments, at least one of the upper chalcogenide material 34a and the lower chalcogenide material 38a can comprise a suitable material for a storage element of a memory cell and the other one of the upper chalcogenide material 34a and the lower chalcogenide material 38a can comprise a suitable material for a selector element of a tnemory cell. For illustrative purposes only, in FIGS. 2A-2D, an embodiment in which the upper chalcogenide material 34a comprises a suitable storage material and the lower chalcogenide material 38a comprises a suitable selector material will be described. In this embodiment, the final memory cell comprises an upper chalcogenide element 34 that is a storage node that can undergo a stable phase change that is nonvolatile at room temperature and a lower chalcogenide element 38 that is a selector node that does not undergo a stable phase change but instead switches temporarily to provide access to the storage element. However, it is to be understood that in other embodiments, the relative positions for the selector node and the storage node can be reversed such that the upper chalcogenide element 34 is the selector node and the lower chalcogenide element 38 is the storage node. It to be understood further that in yet other embodiments, the chalcogenide element that serves as the storage node can be omitted.

In some embodiments, the upper chalcogenide material 34a comprises a phase change material suitable for a storage node that includes chalcogenide compositions such as an alloy including at least two of the elements within the indium(In)-antimony(Sb)-tellurium(Te)(IS T) alloy system, e.g., $In_2Sb_2Te_5$, $In_1Sb_2Te_4$, $In_1Sb_4Te_7$, etc., an alloy including at least two of the elements within the germaniurn(Ge)-antimony(Sb)-tellurium(Te) (GST) alloy system, e.g., $Ge_8Sb_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

In some embodiments, the lower chalcogenide material 38a also comprises a chalcogenide material to form a two terminal selector device comprising the selector node 38 connected to bottom and middle electrodes 40 and 36. Such a selector device is sometimes referred to as an Ovonic Threshold Switch (OTS). In this connection, the lower chalcogenide material 38a suitable to form an OTS may include a chalcogenide composition including any one of the chalcogenide alloy systems described above for the storage node. In addition, the lower chalcogenide material 38a may further comprise an element to suppress crystallization, such as arsenic (As). When added, an element such as As suppresses crystallization by inhibiting any non-transitory nucleation and/or growth of the alloy. Accordingly, the selector node may be configured to switch to a conductive state when a potential exceeding a threshold voltage is applied across the selector node. In addition, the conductive state can be maintained while a sufficient holding current is maintained across the selector node. Examples of materials suitable for forming an OTS include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Figure 2B:
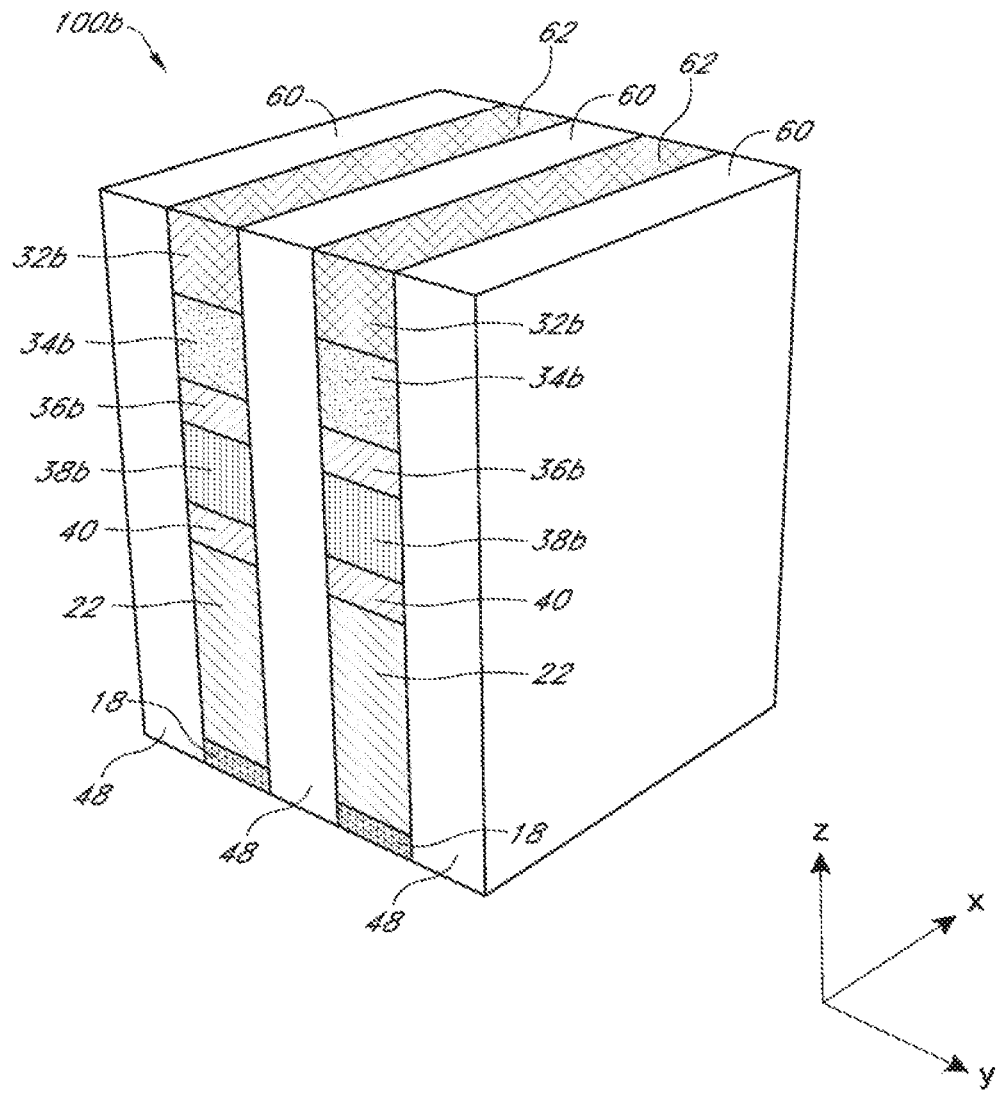

Referring to the intermediate array structure 100b of FIG. 2B, the method of forming conductive lines may additionally include subtractively patterning the material stack of the intermediate array structure 100a of FIG. 2A to form a lower line stack extending in the x-direction. As used herein, "subtractive patterning" refers to a process where a structure to be defined, such as the lower line stack described above, is formed by removing materials to define that structure. For example, the subtractive patterning process may include lithographically providing etch mask structures (e.g., photoresist pattern or a hard mask pattern, not shown) areas to be patterned, followed by etching, such that materials in areas masked by the mask structures are protected while materials in exposed areas are removed by the etch removal process.

Still referring to FIG. 2B, suhtractively patterning the lower line stack includes forming an etch mask pattern comprising lines extending in the x-direction. Subsequently, using the patterned etch mask comprising lines, exposed regions of the material stack between the lines of the etch mask pattern are etched. The lower line stack of the intermediate array structure 100b of FIG. 2B is formed by etching the material stack of FIG. 2A starting from the top, in the order of etching the upper electrode material 32a, the upper chalcogenide material 34a, the middle electrode material 36a, the lower chalcogenide material 38a, the lower electrode material 40a, the lower conductive material 22a, and the first seeding material 18a. The resulting lower line stack of FIG. 2B comprises a first seeding line 18 over the substrate (not shown), a lower conductive line 22 on the first seeding line 18, a lower electrode line 40 on the lower conductive line 22, a lower chalcogenide line 38b on the lower electrode line 40, a middle electrode line 36b on the lower chalcogenide line 38b, an upper chalcogenide line 34b on the middle electrode line 36b, and an upper electrode line 32b on the upper chalcogenide line 34b.

Once the lower line stack is subtractively patterned, spaces between adjacent line stacks are filled with a dielectric material to form first isolation dielectric regions 48. Suitable dielectric materials can include, for example, silicon oxide and silicon nitride, which may be deposited by suitable gap-filling processes such as high-density plasma (HDP) processes, spin-on-dielectric (SOD) processes, sub-atmospheric chemical vapor deposition (SACVD) processes, and atomic layer deposition (ALD) processes, among others. Once the inter-line spaces between adjacent lower line stacks are filled with the dielectric material to form the isolation dielectric regions 48, the intermediate array structure 100b is chemical-mechanically polished to expose a substantially planar surface comprising alternating electrode surfaces 60 and isolation surfaces 62. As used herein, a "substantially planarized surface" refers to a surface that has been chemically-mechanically polished, although a step height between adjacent electrode surface 62 and the isolation surface 60 may be present due to slight differences in the removal of material forming those surfaces, as discussed herein. Such a step height can result from a polish rate difference between the electrode and isolation surfaces 62 and 60. In various embodiments described herein, the step height is about equal or less than the smaller of the widths of the upper electrode line 32b and the isolation dielectric region 48.

Figure 2C:
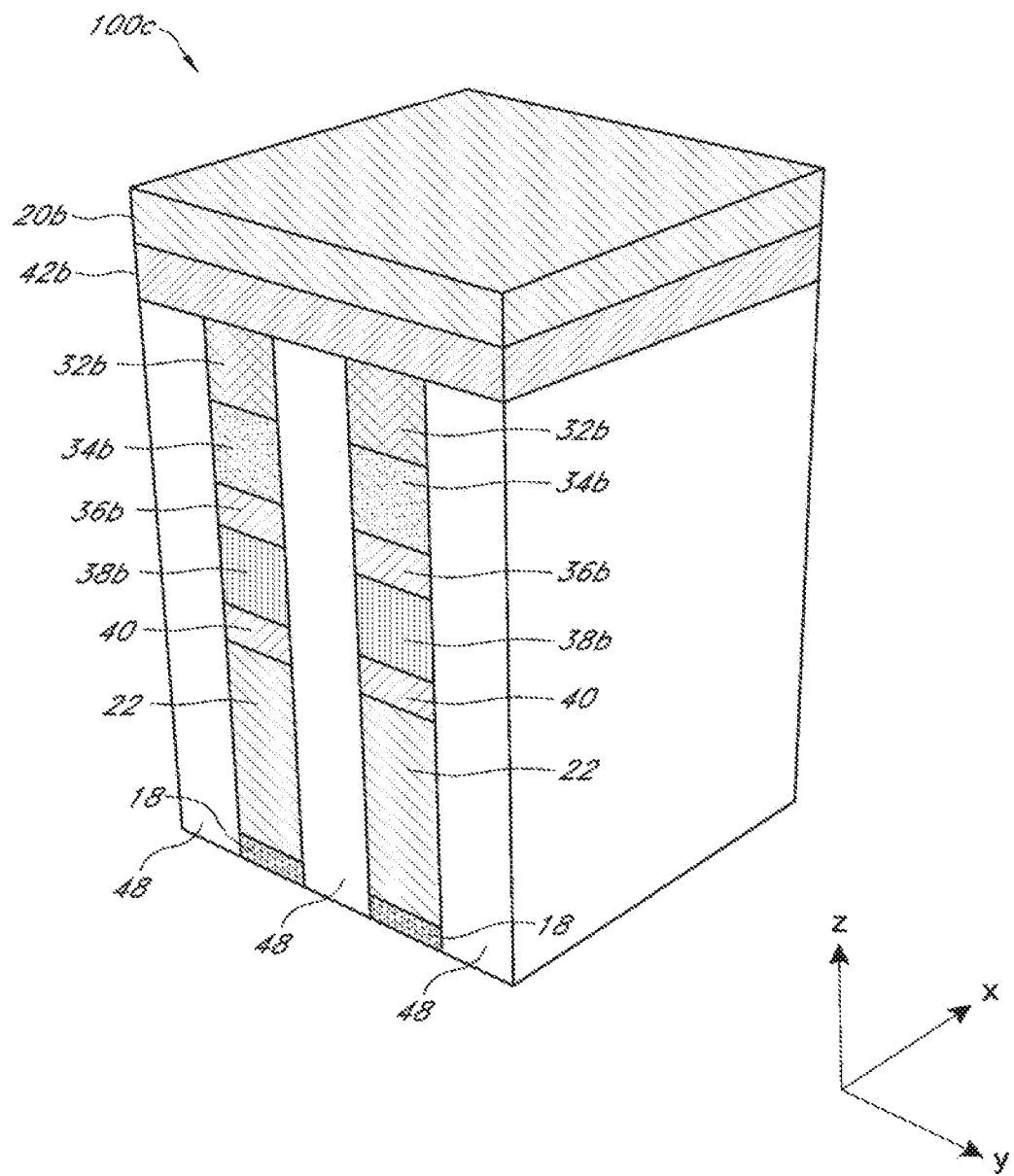

Referring to an intermediate array structure 100c in FIG. 2C, the method of forming conductive lines may additionally include depositing a second seeding material 42b on the substantially planarized surface of the intermediate array structure 100b in FIG. 2B, and further depositing an upper conductive material 20b comprising tungsten on the second seeding material 42b.

The discussion above pertaining to the first seeding material 18a of FIG. 2A similarly applies to the second seeding material 42b. In contrast to FIG. 2A, however, the second blanket seeding material 42b is deposited over the electrode surface 62 and the isolation surface 60 of the lower line stack in FIG. 2B. Similar to FIG. 2A, the second seeding material 42b serves to provide a homogenous surface for subsequent deposition of the upper conductive material 20b. Similar advantages, materials, deposition methods, and dimensions of the seeding material 12 first blanket seeding material 18a described above in connection with FIGS. 1B and 2A applies to the second seeding material 42b of FIG. 2C.

In addition, similar to FIG. 2A, the upper conductive material 20b of FIG. 2C can comprise similar materials having similar dimensions and deposited using similar methods as discussed in connection with the lower conductive material 22a, Advantages of depositing the lower conductive material 22a on the first seeding material 18a as discussed in FIG. 2A, such as higher average grain size, and/or more uniform in size distribution, and/or a more uniform phase of the grains, and suppression of undesired phases (e.g., such as beta-phase tungsten) equally apply to upper conductive material 22b on the second seeding material 42b.

Still referring to FIG. 2C, in some embodiments, when first isolation dielectric regions 48 include silicon oxide, deposition of the upper conductive material 20h directly on the surface comprising alternating electrode surfaces 60 and isolation surfaces 62 can result in the upper conductive material 20b comprising a substantial amount of beta-phase tungsten, where tungsten is the upper conductive material 20b. As discussed above, under certain circumstances, formation of beta-phase tungsten may be facilitated by the presence of oxygen in the silicon oxide. In contrast, when the upper conductive material 20b is deposited on the intervening second seeding material 42b as illustrated in FIG. 2C, the resulting upper conductive material 20b can substantially only include a single alpha-phase tungsten, and can be substantially free of beta-phase tungsten. In some embodiments, the upper conductive material 20b can consist essentially of alpha-phase tungsten, as illustrated by a lack of peaks attributable to other phases of tungsten in an x-ray diffraction spectra of the upper conductive material 20b.

In some other embodiments, when the upper electrode lines 32b include carbon and the upper conductive material 20 includes tungsten, deposition of the upper conductive material 20b directly on the surface comprising alternating electrode surfaces 60 and isolation surfaces 62 can result in the upper conductive material 20h comprising a tungsten carbide phase, which may be present at an interface between the upper conductive material 20b and the underlying electrode surface 60. Without being bound to any theory, formation of a tungsten carbide phase may be facilitated by the presence of carbon in the upper electrode lines 32b. In contrast, when the upper conductive material 20b is deposited on the intervening second seeding material 42b as illustrated in FIG. 2C, the resulting upper conductive material 20b can substantially comprise a single alpha-phase tungsten, and can be substantially free of tungsten carbide phase.

Figure 2D:
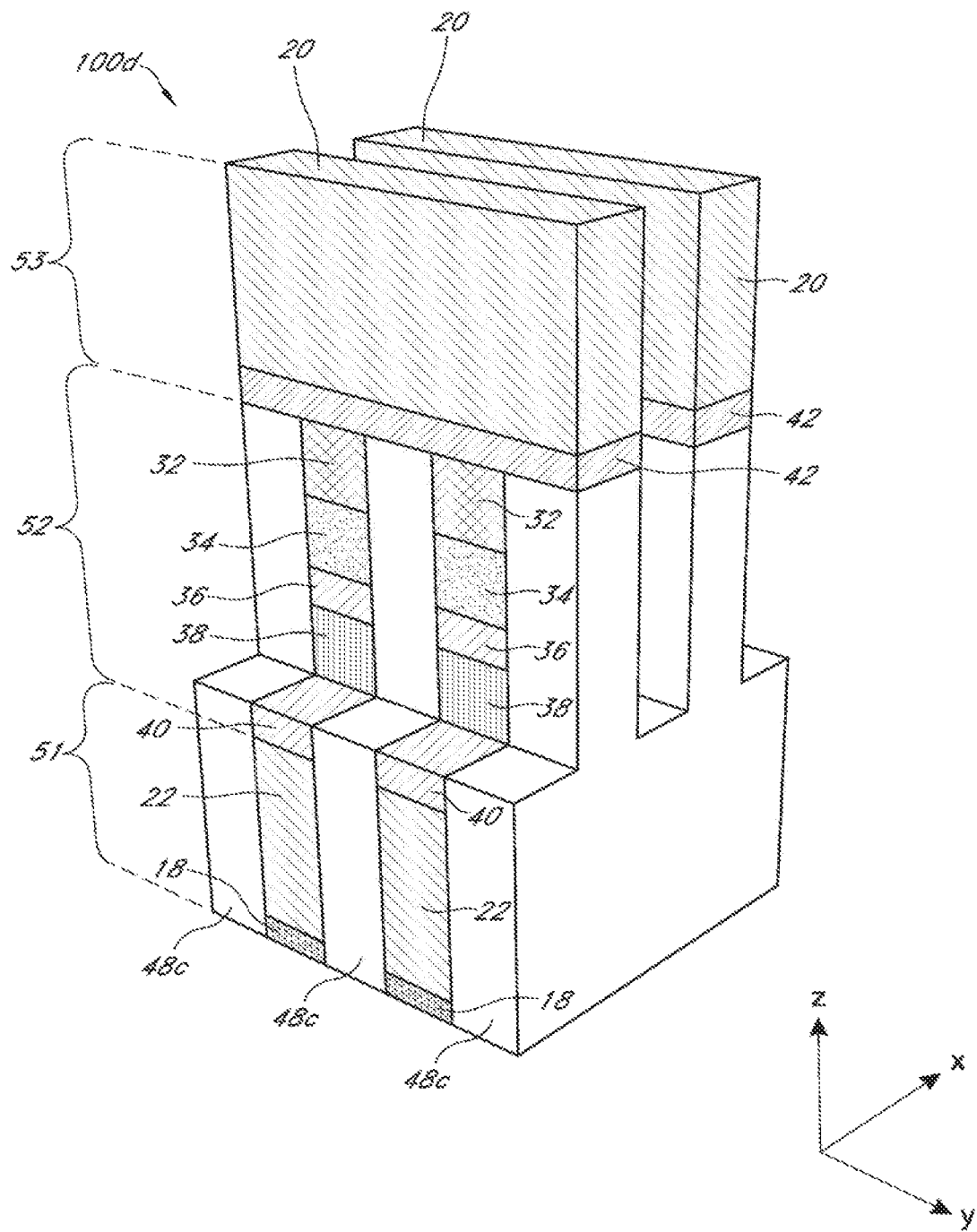

Referring to intermediate array structure 100d in FIG. 2D, the method of forming conductive lines further includes subtractively patterning to form an upper line stack including the upper conductive line 20 and second seeding line 42. Forming the upper line stack includes forming an etch mask pattern (not shown comprising lines extending in the y-direction and etching the exposed regions to form upper conductive lines 20. In the embodiment of FIG. 2D, etching results in the upper conductive material 20b and the second seeding material 42b of FIG. 2C being etched into the upper line stack including the upper conductive line 20 on the second seeding line 42. In addition, portions of the lower line stack extending in x-direction defined in FIG. 2B, including the upper electrode line 32b, the upper chalcogenide line 34b, middle electrode line 36b, and lower chalcogenide line 38a, are etched between the mask line patterns extending in the y-direction, resulting in a two-dimensionally confined stack including the upper electrode 32, the upper chalcogenide element 34, the middle electrode 36, and the lower chalcogenide element 38 that are electrically confined in both x and y-directions. In the illustrated embodiment of FIG. 2D, etching is stopped after etching the lower chalcogenide line 38b of FIG. 2C such that the lower conductive line 22 and the lower electrode line 40 are unchanged after defining the two-dimensionally confined stack 52.

FIG. 2D illustrates a phase change memory device structure that is formed by the processes described above. The phase change memory device structure comprises a lower conductive line stack 51 extending in the x-direction and including the first seeding line 18 over the substrate and the lower conductive line 22 on the first seeding line 18. The phase change memory device structure additionally includes the phase change memory cell stack 52 on the lower conductive line stack 51, including the lower electrode line 40 extending in the x-direction, the two-dimensionally confined stack including the lower chalcogenide element 38 disposed on the first electrode line 40, the middle electrode 36 disposed on the lower chalcogenide element 38 (e.g., a selector node), the upper chalcogenide element 34 (e.g., a storage node) on the middle electrode 36, the storage node 34 disposed on the middle electrode 36, and the upper electrode 32 disposed on the upper chalcogenide element 34. The phase change memory device structure further includes an upper conductive line stack 53 on the upper electrode 32 and extending in the y-direction, including the second seeding line 42 on the upper electrode 32 and the upper conductive line 20 on the second seeding line 42. Subtractively patterned upper conductive line stack 53, phase change memory cell stack 52, and lower conducive line stack as described above form the intermediate array structure 100d of FIG. 2D.

The stack configuration of the memory device structure in FIG. 2D represents an example configuration according to some embodiments. That is, other stack configurations are possible. For example, as discussed above in some embodiments, the positions of the selector node and the storage node may be interchanged with one another such that either one of the lower and upper chalcogenide elements 38 and 34 can be a storage node and vice versa.

In some embodiments, any one or both of the lower and upper chalcogenide elements 38 and 34 can be electrically isolated in only one of the two lateral directions. For example, the lower chalcogenide element 38 can extend in the x-direction, along with the first seeding line 18, the lower conductive line 22 and the first electrode line 40. Similarly, the upper chalcogenide element 34 can extend in the y-direction, along with the upper conductive line 20 and the second seeding line 42.

In some embodiments, the upper electrode 32 can also be electrically isolated in only one lateral direction such that it extends in the x-direction, such that the upper conductive line stack includes the second electrode 32. In other embodiments, both lower and upper electrodes 40 and 32 can be confined in both lateral directions.

In some embodiments, one of the lower and upper chalcogenide elements 38 and 34 can be omitted. In yet other embodiments, any one or more of the lower electrode 40, the middle electrode 36, and the upper electrode 32, may be omitted.

As described above, once the upper line stack, the cell stack 52, and the lower line stack are defined by subtractively patterning as discussed above, spaces formed by subtractively etching are filled with a dielectric to form second isolation dielectric regions similar to first isolation dielectric regions 48 of FIG. 2B.

Referring back to FIG. 2B, the lower line stack resulting from patterning and etching with a first photo mask in some embodiments has a first line width in the y-direction selected to be the range between about 40 nm and about 60 nm, for example about 50 nm. In other embodiments, the lower line stack has a line width selected to be the range between about 25 nm and about 40 rim, for example about 35 nm. In other embodiments, the lower line stack has a line width selected to be the range between about 18 nm and about 25 nm, for example about 20 nm. In yet other embodiments, the lower line stack has a line width selected to be the range between about 5 nm and about 18 nm, for example about 14 nm. Smaller dimensions are yet possible, limited only by the lithographic capability employed.

Referring again to FIG. 2D, the upper line stack resulting from patterning and etching with a second photo mask has a second line width in the x-direction similar to the line width of the lower line stack of FIG. 2B.

Still referring to FIG. 2D, in some embodiments, the first seeding line 18 has a thickness selected to be in the range between 0.5 and about 4.5 nm, for example about 2.5 nm, the lower conductive line 22 has a thickness selected to be the range between about 5 nm and about 25 nm, for example about 15 nm, the lower electrode line 40 has a thickness selected to be the range between about 10 nm and about 50 nm, for example about 25 nm, the first chalcogenide element 34 has a thickness selected to be the range between about 5 nm and about 50 nm, for example about 25 nm, the middle electrode 36 has a thickness selected to be the range between about 10 nm and about 100 nm, for example about 25 nm, the upper chalcogenide element 34 has a thickness selected to be the range between about 10 nm and about 50 nm, for example about 25 nm, the upper electrode 32 has a thickness selected to be the range between about 10 nm and about 100 nm, for example about 25 nm, the second seeding line 42 has a thickness selected to be in the range between 0.5 and about 4.5 nm, for example about 2.5 nm, and the upper conductive line 20 has a thickness selected to be the range between about 5 nm and about 25 nm, for example about 15 nm.

It will be appreciated that in various embodiments for the combination of first and second line width dimensions and the various thickness values described above, where first and second seeding layers 18 and 42 are present, the relative fraction of the combined thicknesses of lower and upper conductive lines 22 and 20 compared to the total thickness of the entire stack of intermediate array structure 100d can be substantially lower than embodiments where first and second seeding layers 18 and 42 are not present. In some embodiments, the fraction of the combined thicknesses of the lower and lower conductive lines 22 and 20 is between about 60% and about 40%, for instance about 50%. In other embodiments, the fraction of the combined thicknesses of the lower and lower conductive lines 22 and 20 is between about 50% and about 30%, for instance about 40%. In yet other embodiments, the fraction of the combined thicknesses of the lower and lower conductive lines 22 and 20 is between about 20% and about 40%, for instance about 30%.

Figure 3:
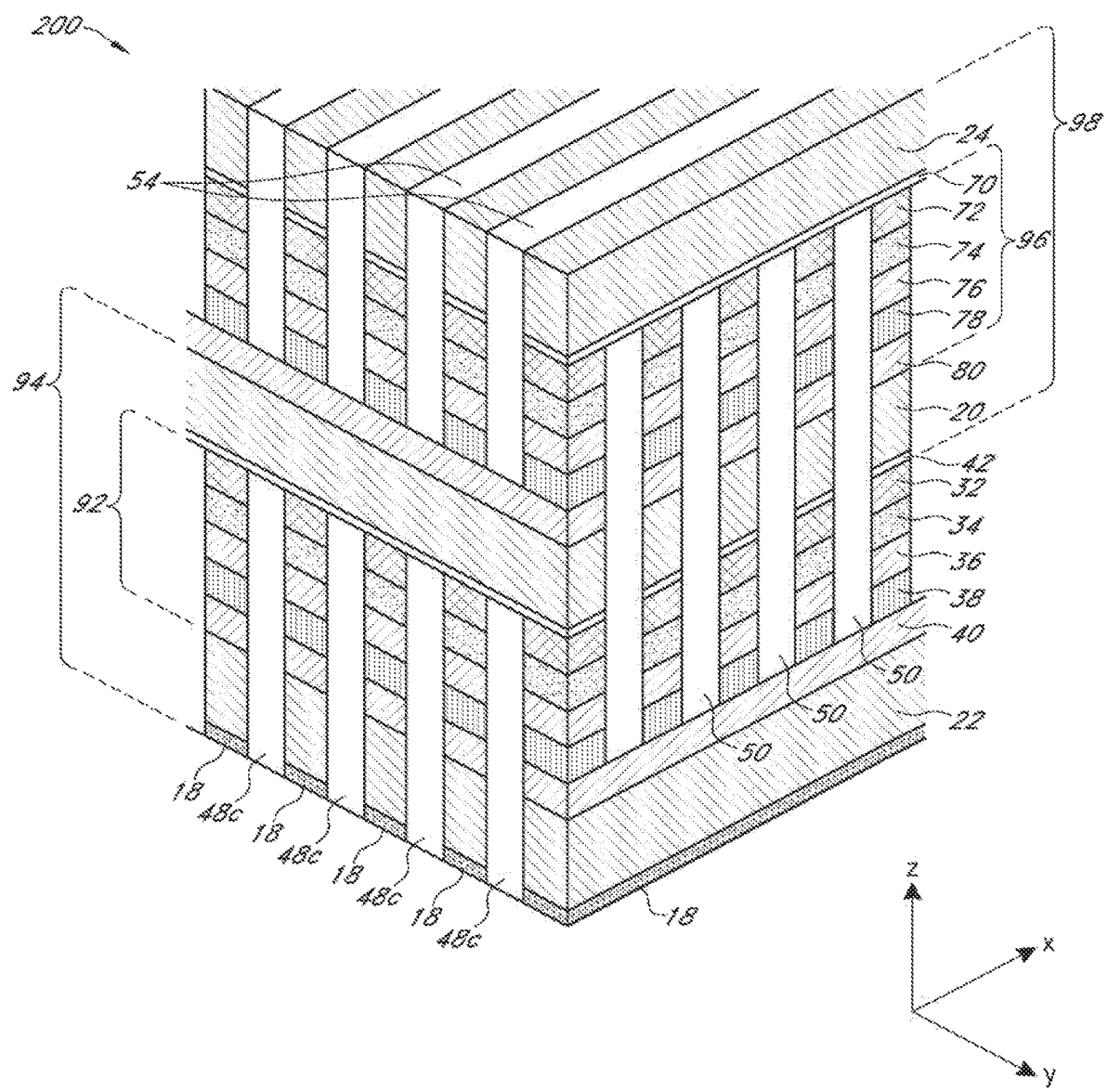
FIG. 3 is a schematic cross-sectional depiction of a memory array according to some other embodiments.

The foregoing described fabrication of an array structure according to some embodiments may be considered to form a single "deck" of phase change memory cells. In one aspect, a deck can be defined as an array of memory cells electrically addressable by a single vertical stack including the lower and upper conductive lines 20 and 22, respectively. However, some other embodiments can have multiple decks, each formed as described herein (e.g., with reference to FIGS. 2A-2D). FIG. 3 describes a fully fabricated dual-deck phase change memory array 200 including a lower deck 94 including first conductive lines 22 extending in the x-direction similar to the lower conductive lines 22 of FIG. 2D and second conductive lines 20 extending in the y-direction similar to the upper conductive lines 20 of FIG. 2D. Similar to FIG. 2D, the lower deck 94 further includes the first seeding line 18 below the first conductive line 22 and a lower phase change memory cell stack 92 on the first conductive lines 22. The lower phase change memory cell stack 92 includes a first lower electrode line 40 extending in the x-direction, a first lower chalcogenide element 38 disposed on the first lower electrode line 40, a first middle electrode 36 disposed on the first lower chalcogenide element 38 (e.g, a selector node), a first upper chalcogenide element 34 (e.g., a storage node) on the first middle electrode 36, and a first upper electrode 32 disposed on the first upper chalcogenide element 34, The lower deck 94 may further comprise a second seeding line 42 on the first upper electrode 32 and the second conductive line 22 disposed on the second seeding line 42.

In a dual-deck phase change memory array 200, an upper deck 98 shares common conductive lines with the lower deck as access lines that interpose an upper phase change memory stack 96 and the lower phase change memory stack 92. FIG. 3 describes the upper deck 98 including second conductive lines 20 extending in the y-direction that are shared as access lines with the lower deck 94 and third conductive lines 24 extending in the x-direction. An upper phase change memory cell stack 96 is disposed on the second conductive lines 20. The upper phase change memory cell stack includes a second lower electrode line 80 extending in the y-direction, a second lower chalcogenide element 78 disposed on the second lower electrode line 80, a second middle electrode 76 disposed on the second lower chalcogenide element 78 (e.g, a selector node), a second upper chalcogenide element 74 (e.g., a storage node) on the second middle electrode 76, and a second upper electrode 72 disposed on the second upper chalcogenide element 74. The upper deck 98 further comprises a third seeding line 70 on the first upper electrode 32 and the third conductive line 24 disposed on the second seeding line 42.

Figure 4:
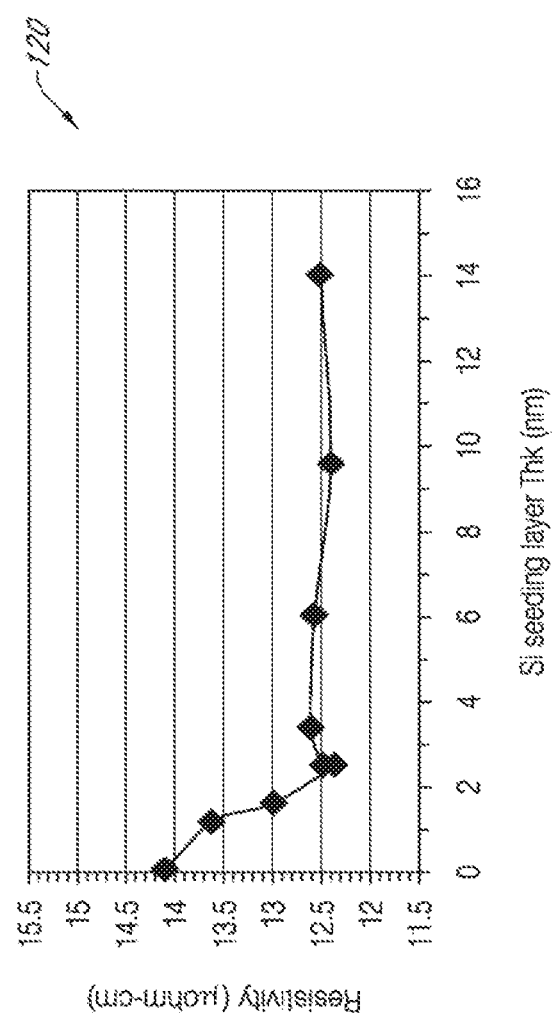
FIG. 4 is a graph illustrating experimental resistivity of a conductive material as a function of a thickness of a seeding material according to some embodiments.

FIG. 4 is a graph 120 illustrating reduction of resistivity of conductive lines comprising substantially single phase tungsten deposited on a seeding material as a function of the thickness of the seeding material thickness according to some embodiments. The illustrated embodiment represents resistivity measurement performed on a tungsten line having a thickness of about 27 nm. The tungsten line is formed on an amorphous silicon line having a thickness ranging from 0 to about 14 nm, which is in turn formed on a carbon line having a thickness of about 15 nm. The y-axis represents the resistivity of the stack of lines and the x-axis represents the thickness of the amorphous silicon line for the stack measured. As illustrated, the resistivity of the tungsten line reduces as the thickness of the underlying amorphous silicon line is increased, up to about nm. For this embodiment, the resistivity of the tungsten line remains approximately constant when the thickness of the underlying amorphous silicon line is increased beyond a thickness of about 2.5 nm.

FIG. 5A is a graph 140 illustrating resistivity of tungsten lines formed on various underlying materials according to some embodiments. The y-axis represents the measured resistivity of tungsten lines formed on different underlying materials and the x-axis represents the thickness of the tungsten line formed on the various underlying materials. In the graph 140, filled diamond symbols 142, open circles 144, and filled triangles 146 represent resistivity versus tungsten line thickness for a tungsten line formed on $SiO_2$, a tungsten line formed on carbon, and a tungsten line formed on 2.5 nm of amorphous silicon on carbon, respectively. As illustrated, at all thicknesses of tungsten lines measured, filed triangles 146 representing resistivity of tungsten lines formed on the amorphous silicon has a lower resistivity compared to filled diamond symbols 142 representing tungsten lines formed on $SiO_2$ and open circles 144 representing tungsten lines formed on carbon. In FIGS. 5B-5D, representative x-ray patterns of a tungsten line formed on $SiO_2$, a tungsten line formed on carbon, and a tungsten line formed on 2.5 nm of amorphous silicon are illustrated, indicating that relatively low resistivity tungsten lines formed on the amorphous silicon compared to relatively high resistivity of tungsten lines formed on $SiO_2$ and tungsten lines formed on carbon is due to the presence of a substantially single alpha-phase tungsten.

FIG. 5B is an x-ray diffraction pattern 150 of a tungsten line formed on $SiO_2$, similar to filled diamond symbols 142 in FIG. 5A, according to one embodiment. They axis represents the intensity of diffracted x-ray photons, and the x-axis represents the 2-theta angle between the incident and the diffracted x-ray beams. In this embodiment, in addition to a peak at about 40 degrees of 2-theta angle representing alpha tungsten, two additional peaks at about 35.5 degrees and about 44 degrees are present, indicating the presence of beta-phase tungsten.

FIG. 5C is an x-ray diffraction pattern 152 of a tungsten line formed on carbon, similar to open circles in FIG. 5A, according to one embodiment. As in FIG. 5B, the y-axis represents the intensity of diffracted x-ray photons, and the x-axis represents the 2-theta angle between the incident and the diffracted x-ray beams. In this embodiment, in addition to a peak at about 40 degrees of 2-theta angle representing alpha tungsten, an additional peak at about 39 degrees is present, indicating the presence of tungsten carbide.

FIG. 5D is an x-ray diffraction pattern 154 of a tungsten line formed on 2.5 nm of amorphous seeding layer over carbon, according to one embodiment. As in FIG. 5B, the y-axis represents the intensity of diffracted x-ray photons, and the x-axis represents the 2-theta angle between the incident and the diffracted x-ray beams. In this embodiment, the only peak present is the peak at about 40 degrees of 2-theta angle representing alpha-phase tungsten. In addition, neither additional peaks indicative of beta-phase tungsten nor tungsten carbide are present.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming an integrated circuit, comprising:
   forming a lower conductive line stack comprising a first seeding line extending in a first direction;
   forming an upper conductive line stack over and across a substantially planar top surface of a second seeding line, the upper conductive line stack comprising tungsten, the second seeding line comprising an amorphous silicon material extending in a second direction different than the first direction, a bottom surface of the second seeding line in contact with a carbon electrode surface and an insulator surface extending in the first direction, wherein a sidewall of the second seeding line is in contact with a second insulator surface extending in the second direction; and
   forming a phase change memory cell stack comprising a chalcogenide element positioned above the lower conductive line stack and below the upper conductive line stack, the carbon electrode interposing the chalcogenide element and the second seeding line.

2. The method of claim 1, further comprising:
   depositing tungsten above the first seeding line in the lower conductive line stack, wherein the tungsten deposited above the first seeding line has a resistivity and a grain size distribution based at least in part on a thickness of the first seeding line.

3. The method of claim 1, wherein forming the phase change memory cell stack further comprises:
   forming a lower electrode;
   depositing a lower chalcogenide element on the lower electrode;
   depositing a middle electrode on the lower chalcogenide element;
   depositing an upper chalcogenide element on the middle electrode; and
   depositing an upper electrode on the upper chalcogenide element.

4. The method of claim 1, further comprising:
   depositing second seeding line material using a deposition method selected from the group consisting of chemical vapor deposition, atomic layer deposition, and physical vapor deposition.

5. The method of claim 1, further comprising:
   depositing the tungsten using physical vapor deposition to form the upper conductive line stack.

6. The method of claim 1, wherein the tungsten has a resistivity based at least in part on an average grain size and a grain size distribution of the tungsten.

7. The method of claim 1, wherein forming the upper conductive line stack comprises:
   forming the upper conductive line stack in contact with the phase change memory cell stack.

8. The method of claim 1, wherein forming the phase change memory cell stack comprises:
   forming the phase change memory cell stack in contact with a portion of the lower conductive line stack.

9. A method of forming a memory device, comprising:
   forming a memory deck, including:
      forming a first plurality of conductive lines extending in a first direction;
      forming a second plurality of conductive lines extending in a second direction different than the first direction;
      forming a plurality of first seeding lines comprising an amorphous silicon material below the second plurality of conductive lines and extending in the second direction, the plurality of first seeding lines having a substantially planar top surface and the second plurality of conductive lines being in contact with and formed across the substantially planar top surface of the plurality of first seeding lines, a bottom surface of the plurality of first seeding lines in contact with a corresponding electrode surface of a plurality of electrode surfaces and a corresponding insulator surface of a plurality of insulator surfaces extending in the first direction; and
      forming a first plurality of memory cell stacks between the first plurality of conductive lines and the plurality of first seeding lines, wherein each memory cell stack of the first plurality of memory cell stacks comprises a chalcogenide element, a carbon electrode interposing the chalcogenide element and a first seeding line of the plurality of first seeding lines, and the carbon electrode in contact with the first seeding line.

10. The method of claim 9, wherein sidewalls of the plurality of first seeding lines are in contact with second insulator surfaces of a plurality of second insulator surfaces extending in the second direction.

11. The method of claim 9, wherein a material of the second plurality of conductive lines has a resistivity based at least in part on a grain size distribution, the grain size distribution being based at least in part on the plurality of first seeding lines having the substantially planar top surface and a thickness of the plurality of first seeding lines.

12. The method of claim 9, further comprising:
   forming a plurality of second seeding lines below the first plurality of conductive lines and extending in the first direction.

13. The method of claim 9, further comprising:
   forming an additional memory deck in contact with the plurality of first seeding lines of the memory deck;
   forming a third plurality of conductive lines in the additional memory deck in the first direction; and
   forming a plurality of third seeding lines in the additional memory deck in the first direction and positioned below the third plurality of conductive lines.

14. The method of claim 13, further comprising:
   forming a second plurality of memory cell stacks between the second plurality of conductive lines and the plurality of third seeding lines.

15. The method of claim 13, wherein the second plurality of conductive lines is shared between the memory deck and the additional memory deck.

16. The method of claim 9, further comprising:
depositing the plurality of first seeding lines on intermetal dielectric surfaces and conductive surfaces of a substrate.

17. A method of forming memory cell, comprising:
forming a first conductive line extending in a first direction;
forming a second conductive line disposed above a seeding line formed of a seeding material comprising an amorphous silicon material, the second conductive line comprising tungsten, the second conductive line extending in a second direction and crossing the first conductive line, the second direction different than the first direction, the seeding line having a substantially planar top surface, a bottom surface of the seeding line in contact with an electrode surface and a first insulator surface in the first direction, wherein a sidewall of the seeding line is in contact with a second insulator surface in the second direction, and the second conductive line being in contact with and formed across the substantially planar top surface of the seeding line, the substantially planar top surface having a local step height variation thickness of about 5 nm, the tungsten having a resistivity based at least in part on a grain size distribution, the grain size distribution, being based at least in part on the seeding line having the substantially planar top surface and a thickness of the seeding line;
forming a chalcogenide element between the first and second conductive lines, wherein the seeding line is interposed between the second conductive line and the chalcogenide element, the seeding line contacting the second conductive line; and
forming a carbon electrode between the chalcogenide element and the seeding line, the carbon electrode in contact with the seeding line.

18. The method of claim 17, wherein the second conductive line comprises alpha-phase tungsten and is substantially free of beta-phase tungsten.

19. The method of claim 17, wherein the seeding line has a thickness between about 1 nm and about 3 nm.

20. The method of claim 17, wherein the second conductive line has a thickness not exceeding about 10 nm.

\* \* \* \* \*